(12) United States Patent
Wang

(10) Patent No.: US 8,148,658 B2
(45) Date of Patent: Apr. 3, 2012

(54) NON-CONTACT TOUCH SWITCH

(76) Inventor: Chi-Jen Wang, Wugu Township, Taipei County (TW)

( * ) Notice: Subject to any disclaimer, the term of this patent is extended or adjusted under 35 U.S.C. 154(b) by 565 days.

(21) Appl. No.: 12/169,970

(22) Filed: Jul. 9, 2008

(65) Prior Publication Data

US 2010/0007405 A1    Jan. 14, 2010

(51) Int. Cl.
*H03K 17/975* (2006.01)
(52) U.S. Cl. .................... 200/600; 200/341
(58) Field of Classification Search ............ 200/600
See application file for complete search history.

(56) References Cited

U.S. PATENT DOCUMENTS

| | | | | |
|---|---|---|---|---|
| 4,755,072 A | * | 7/1988 | Hoornweg ............ | 400/490 |
| 6,114,674 A | * | 9/2000 | Baugh et al. .......... | 219/543 |
| 6,265,682 B1 | * | 7/2001 | Lee ................... | 200/600 |
| 6,392,549 B1 | * | 5/2002 | Wu .................... | 340/573.2 |
| 6,555,772 B1 | * | 4/2003 | Chou ................. | 200/61.45 R |
| 6,667,563 B2 | * | 12/2003 | Bae et al. ............ | 307/112 |
| 7,053,799 B2 | * | 5/2006 | Yu et al. ............. | 341/31 |
| 7,183,673 B2 | * | 2/2007 | Dinn et al. .......... | 307/139 |

* cited by examiner

*Primary Examiner* — Elvin G Enad
*Assistant Examiner* — Lisa Klaus

(57) ABSTRACT

A non-contact touch switch comprises an outer cover installed at an outlet of an AC power source, a microcomputer control circuit installed on an inner side of the outer cover, a medium transferring interface installed on the outer cover and connecting with the microcomputer control circuit, a start switch with one end thereof being connected with the microcomputer control circuit and another end thereof being disposed with a control contact connected to the power source so as to control electrifying time of an electrical device connected therewith, and a power interceptor disposed between the microcomputer control circuit and the start switch capable of directly intercepting, rectifying, and stabilizing an external power supply as a power supply available for a normal operation of an internal circuit.

11 Claims, 8 Drawing Sheets

NON-CONTACT TOUCH SWITCH

BACKGROUND OF THE INVENTION

1. Field of the Invention

The present invention relates to a non-contact touch switch, and more particularly to a non-contact switch using a human body as an inductive medium to intercept a power supply automatically without a battery for reducing the volume thereof and allowing a control circuit to start an AC switch power.

2. Description of Related Art

A simple touch induction controller is mainly used to replace a physical mechanical switch in a capacitance type touch switch; because it is a "non-contact" controller and is not exposed outside like the physical mechanical switch, abrasion will not be caused such that the reliability can be elevated substantially, and because the inside thereof is not installed with any mechanical structure, the durability is good and the design degree of freedom is high. Besides, the electroplating is unnecessary because contacts are maintained in an insulation state and the waterproof and dustproof abilities can be obtained easily. Hence, this technology can be adopted in more application domains because so many merits are gathered in it.

However, the sensitivity of such kind of non-contact touch switch is very easy to be influenced by a human body medium and surrounding electric fields; it is hitherto only applied on a low voltage DC control. But, a touch switch used for a high voltage AC control has already appeared in the current market accompanying the progress of technology, for example, a customized and marketing product currently available in the network produced by Tranzzend International Co., Ltd.

However, the product mentioned above still has a very big problem in application, in fact, a micro-active non-contact switch is still adopted to obtain an inner part of a structure and a battery must be additionally installed on a bottom of a combined product so as to acquire a stable power supply to enable an internal control circuit to maintain a normal work such that not only it causes a volume of the switch to be increased relatively but also the battery must be detached down and replaced with a new one every other period of time, otherwise the circuit will be out of order to cause inconvenience on use, and this is its biggest deficit.

In addition, no matter what the power is mechanical or electronic, an outlook modeling of the product is fixed and unable to be changed arbitrarily while leaving the factory such that styles of the products are few, and the outlooks thereof are inflexible and lack of variation, unable to match various different decorations while being assembled, and cannot be further varied according to an individual requirement at a later date as well as does not allow a self-style to be expressed.

SUMMARY OF THE INVENTION

The main object of the present invention is to provide a non-contact switch using a human body as a conductive medium to intercept an AC power supply automatically by means of a programming process without a battery to reduce the volume substantially.

For attaining to the object mentioned above, the present invention discloses a non-contact touch switch, with which a control circuit is utilized to accurately switch an AC power source by using a human body as an inductive medium, comprising:

an outer cover installed at an outlet of the AC power source;
a microcomputer control circuit installed on an inner side of the outer cover;
a medium transferring interface installed on the outer cover and connecting with the microcomputer control circuit;
a start switch with one end thereof being connected with the microcomputer control circuit and another end thereof being disposed with a control contact connected to the AC power source, so as to control electrifying, time of an electrical device connected therewith; and
a power interceptor disposed between and connected to the microcomputer control circuit and the control contact of the start switch, capable of directly intercepting, rectifying, and stabilizing an external power supply through the power source as a power supply available for a normal operation of an internal circuit; whereby, a volume of the switch is reduced substantially, and no battery is required additionally.

Another object of the present invention is to provide a human-based switch which is capable of being replaced the appearance thereof by a user conveniently to match various different indoor decorations.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
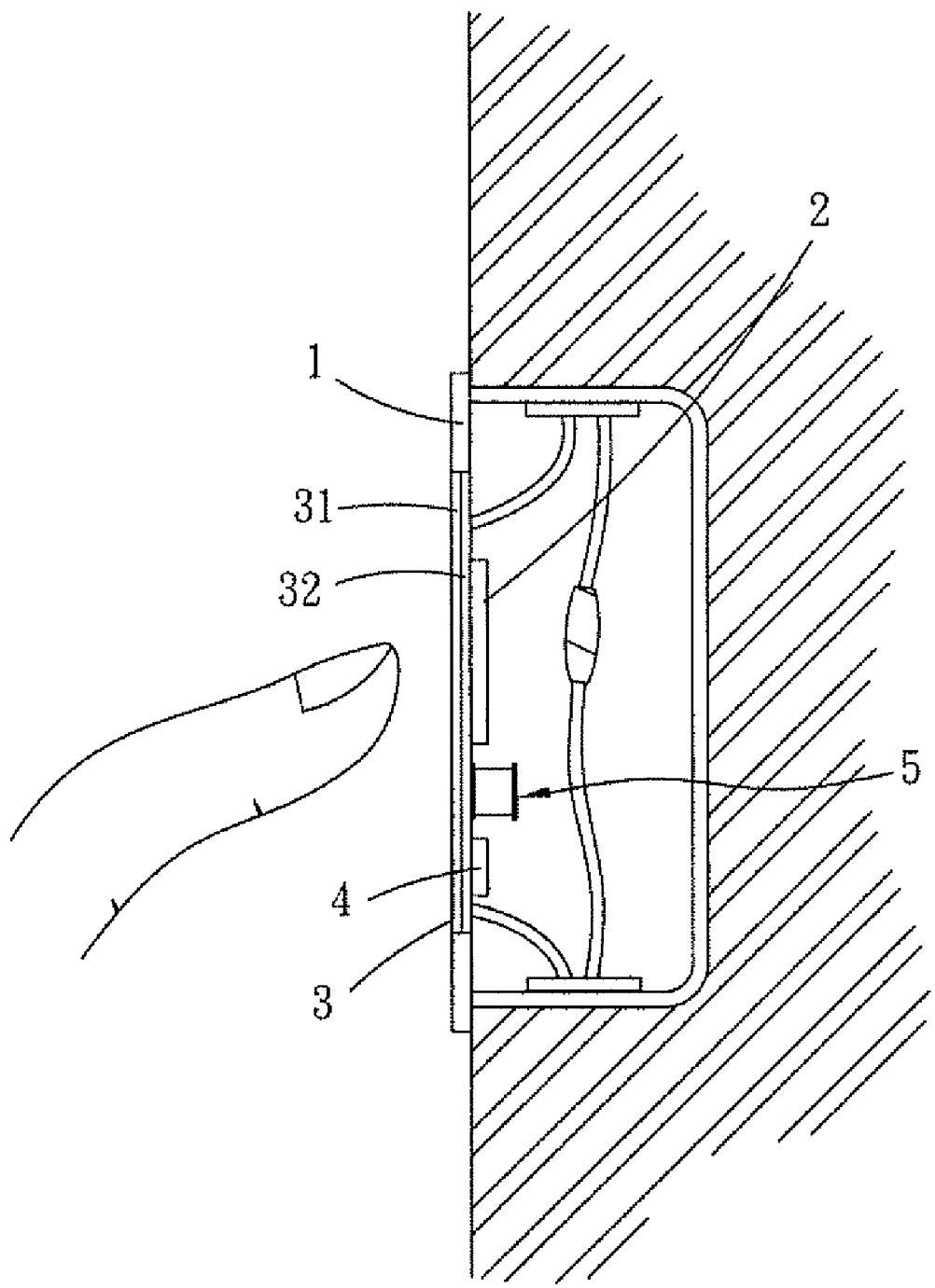
FIG. 1 is a schematic view, showing a non-contact touch switch of the present invention while being put into practice.
Figure 2:
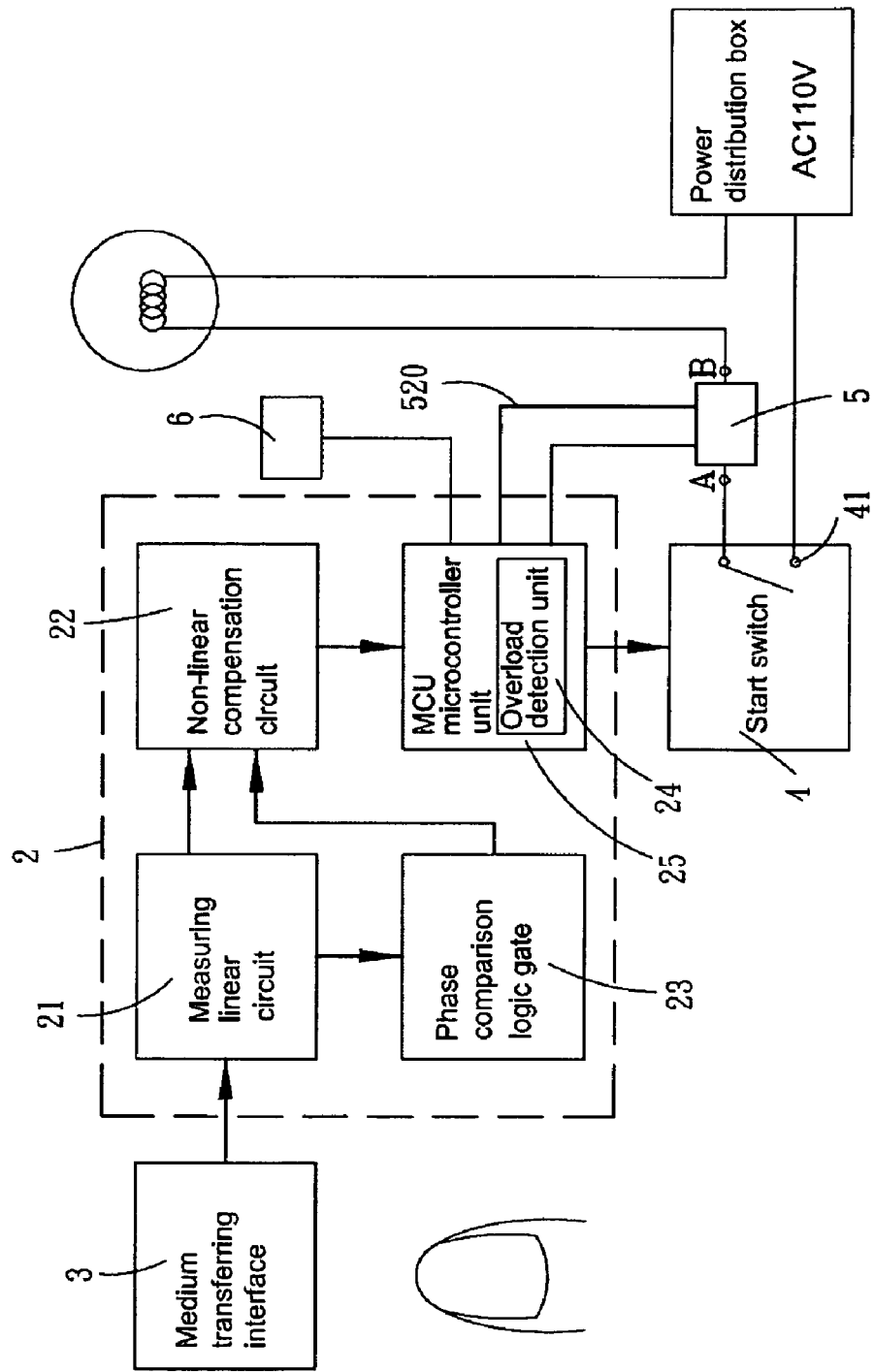
FIG. 2 is a block diagram, showing a circuit of a non-contact touch switch of the present invention.
Figure 3:
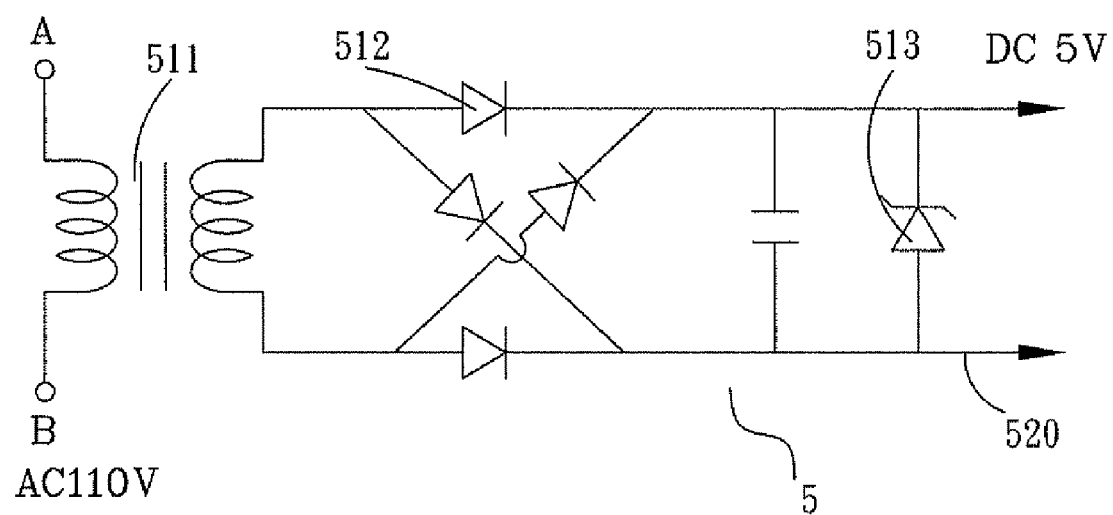
FIG. 3 is a circuit diagram, showing a power interceptor of a first preferred embodiment according to the present invention.

Please refer to FIGS. 1 to 10. A non-contact touch switch according to the present invention allows utilizes a control circuit to accurately switch an AC power source by using a human body as an inductive medium, comprising:
an outer cover 1 disposed at an outlet of the AC power source;
a microcomputer control circuit 2 installed on an inner side of the outer cover 1;
a medium transferring interface 3 installed on the outer cover 1 and connecting with the microcomputer control circuit;
a start switch 4 having one end thereof being connected with the microcomputer control circuit 2 and another end thereof being disposed with a control contact 41 to be connected to the AC power source so as to control electrifying time of an electrical device such as an indoor, or outdoor lighting system connected therewith; and a power interceptor 5 being disposed between and connected to the microcomputer control circuit 2 and the control contact 41 of the start switch 4, capable of directly intercepting, rectifying, and stabilizing an external power supply from a general public power through the switch power source to act as a power supply available for a normal operation of an internal circuit.

Whereby, a volume of a combined switch is allowed to reduce substantially, no additional attached battery is required and the control function can then be brought into full play, a normal work can be maintained once the public power is connected, and the trouble of detaching and replacing a battery frequently can be avoided to allow the use of a switch to be more convenient.

A medium constant in the induction area can then be changed to switch on the switch when a finger touch an induction area lightly: a human body is adopted as an inductive medium to operate the switch of the present invention; the entire volume of the switch is small and the operation thereof is accurate and reliable, an internal circuit thereof is compact and can intercept the AC power supply automatically, and no battery and mechanical contact are provided. Furthermore, a zero-phase detonation type switch is adopted to prevent sparks such that the switch of the present invention is flame-proof and electric-shock-proof. The switch of the present invention is suitable for being installed not only in a house for hiding the switch and matching up the interior decoration but also in a public place, a high salinity seashore area or a high corrosive sulfide place for reducing maintenance expenses. Besides, the switch of the present invention can be installed in a highly infective environment such as hospital or quarantine station to lessen personal infection, or in a highly dangerous area such as fuel storage depot, oil tank, or oil refinery to enhance the public safety.

In addition, for further strengthening the safety protection measures of the circuit, an overload detection unit 24 may further be installed in the microcomputer control circuit 2 to enable the power interceptor 5 and the microcomputer control circuit 2 to have a synchronic function. When the control contact 41 of the start switch 4 is connected with a power supply, the overload detection unit 24 can then process an instant detection to detect whether there is an overload effect at the same time. If a preset standard load value is exceeded, the microcomputer control circuit 2 will then process a start switch 4 terminating procedure; the procedure is not stopped until the overload situation is eliminated. Hence, the use safety of the circuit can be assured to avoid inducing a fire accident probably caused from a long term overload to endanger the public safety like a general marketing conventional switch does.

Referring to FIGS. 1 and 2 again, the medium transferring interface 3 provides a non-conductive substrate 31 and an etched circuit board 32 attached to the non-conductive substrate 31; the microcomputer control circuit 2 further comprises a measuring linear circuit 21, a non-linear compensation circuit 22, a phase comparison logic gate 23 and an MCU microcontroller unit 25; an end of the measuring linear circuit 21 is connected with the medium transferring interface 3, and another end thereof is respectively connected with the not-linear compensation circuit 22 and the phase comparison logic gate 23; one end of the MCU microcontroller unit 25 is connected with the non-linear compensation circuit 22, and another end thereof is connected with the start switch 4; the start switch 4 is started with a zero-phase trigger type start switch; the power interceptor 5 is disposed between the MCU microcontroller unit 25 and the control contact 41 of the start switch 4.

In addition, a buzzer 6 may further be disposed on the microcomputer control circuit 2 to allow the switch to generate a mechanical switch switching sound to enable a user to feel more realistic while operating the switch.

Please refer to FIGS. 2 to 7. There are many forms for an interceptor according to the present invention; one of them is a structure shown in FIG. 3 in which a current amplifying transformer 511 is installed in series on input end contacts A and B of the control contact 41 of the start switch 4, a secondary pole thereof is connected to a bridge rectifier 512 and a diode voltage regulator 513 formed into a power supply circuit with pins of the MCU microcontroller unit 25.

Figure 4:
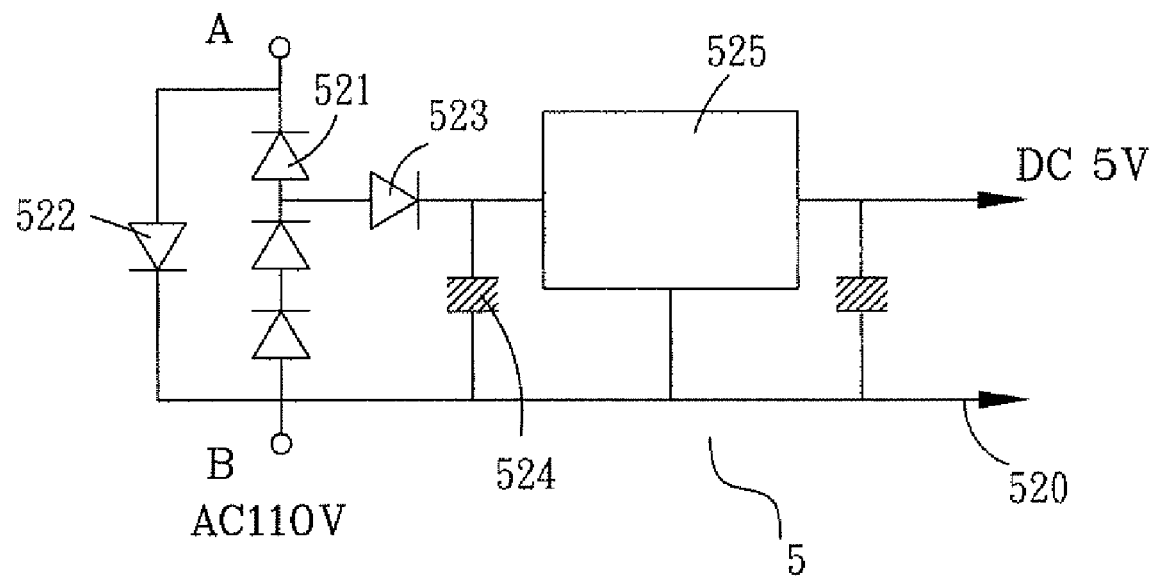
FIG. 4 is a circuit diagram, showing a power interceptor of a second preferred embodiment according to the present invention.
Figure 5:
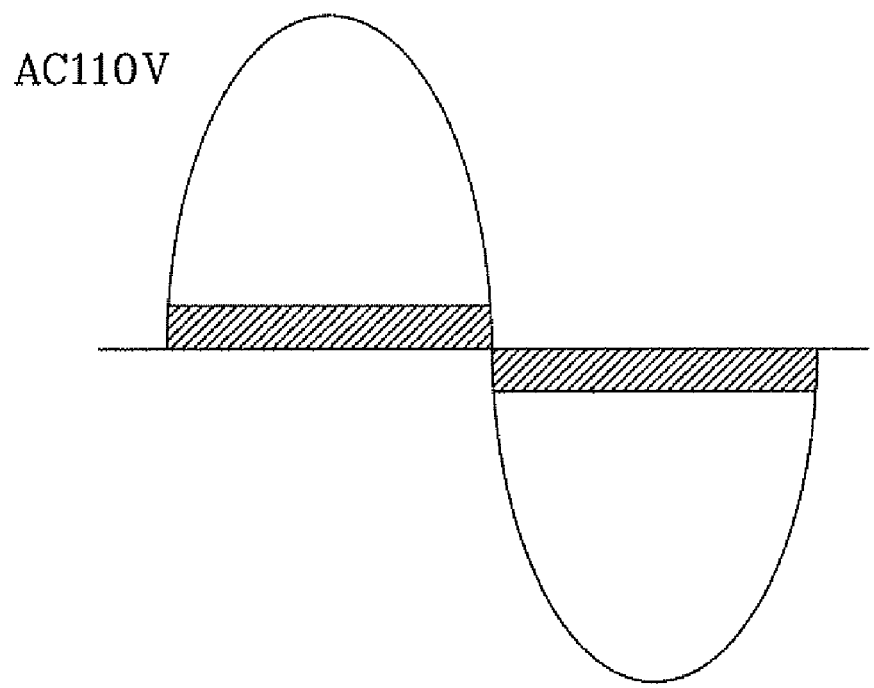
FIG. 5 is a graph, showing a voltage level interception of the second embodiment according to the present invention.

Please refer to FIGS. 4 and 5. Another design of the interceptor 5 is illustrated: the interceptor 5 mainly comprises a plurality of diodes 521 connecting in series with the input ends A and B of the control contact 41 of the start switch 4, a backward diode 522 connecting in parallel with two terminals the diodes 521, a voltage dividing diode 523 connecting with a middle contact of the diodes 521 and a voltage stabilizing IC 525 respectively. Two sides of the voltage stabilizing IC 525 are respectively connected in series with a capacitor 524 respectively to form a power supply circuit 520 with the contact pins of the MCU microcontroller unit 25 such that voltages indicated with hatched portions in FIG. 5 can then be intercepted automatically from the power supply AC110V of the public utility.

Figure 6:
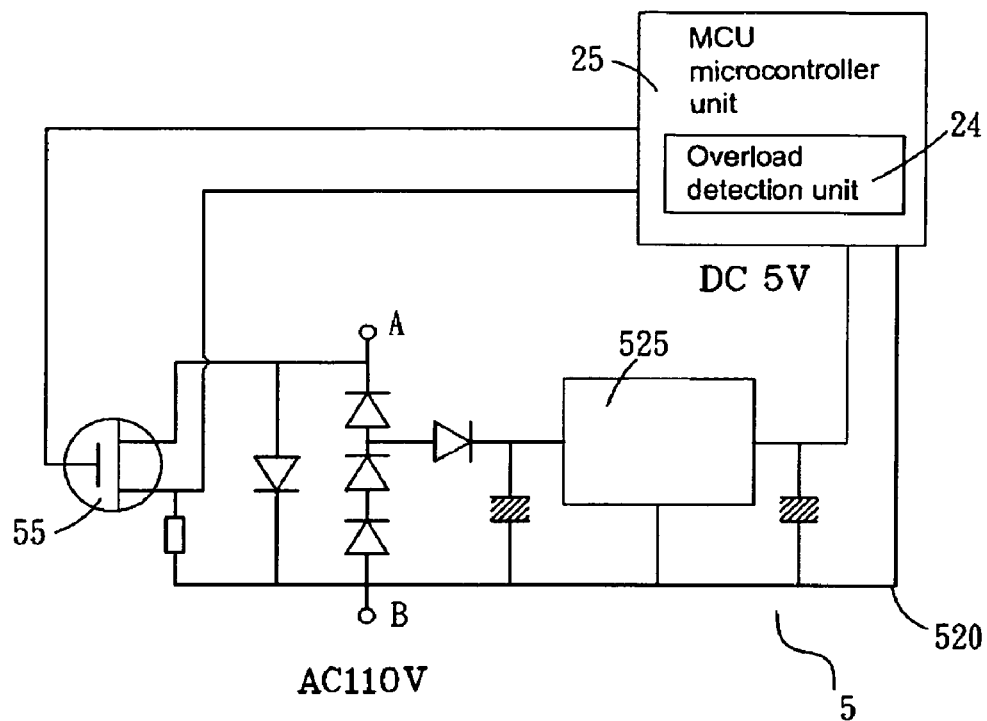
FIG. 6 is a circuit diagram, showing a power interceptor of a third preferred embodiment according to the present invention.
Figure 7:
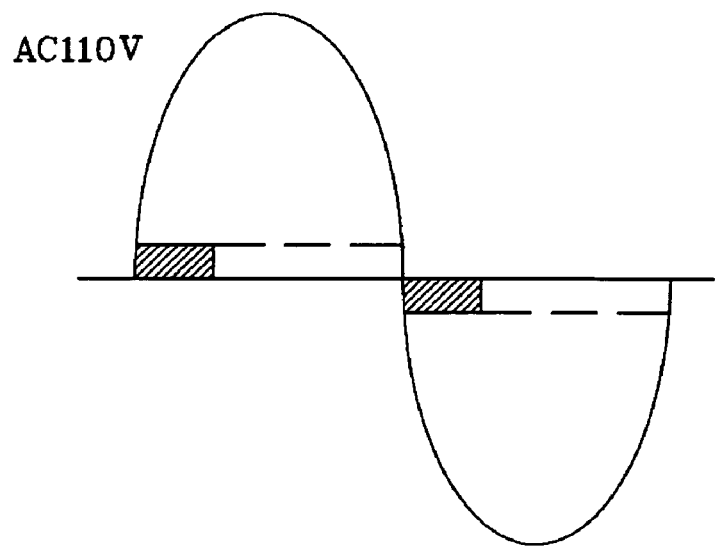
FIG. 7 is a graph, showing a voltage level interception of the third embodiment according to the present invention.

Please refer to FIGS. 6 and 7. The aforementioned interceptor 5 may also further be disposed with a field effect transistor 55 to constitute an integrated circuit (IC) to allow a source and a drain of the field effect transistor 55 to be respectively coupled to two terminals of the aforementioned plurality of serial diodes 521, a gate thereof is connected to another pin of the MCU microcontroller unit 25 such that the entire circuit can be allowed to have the energy saving effect, the intercepted voltages are hatched portions shown in FIG. 7, the operation tends to become more perfect and saves one-third of the electricity consumed in the proceeding embodiment and can reduce the power consumption and the heat.

Figure 8:
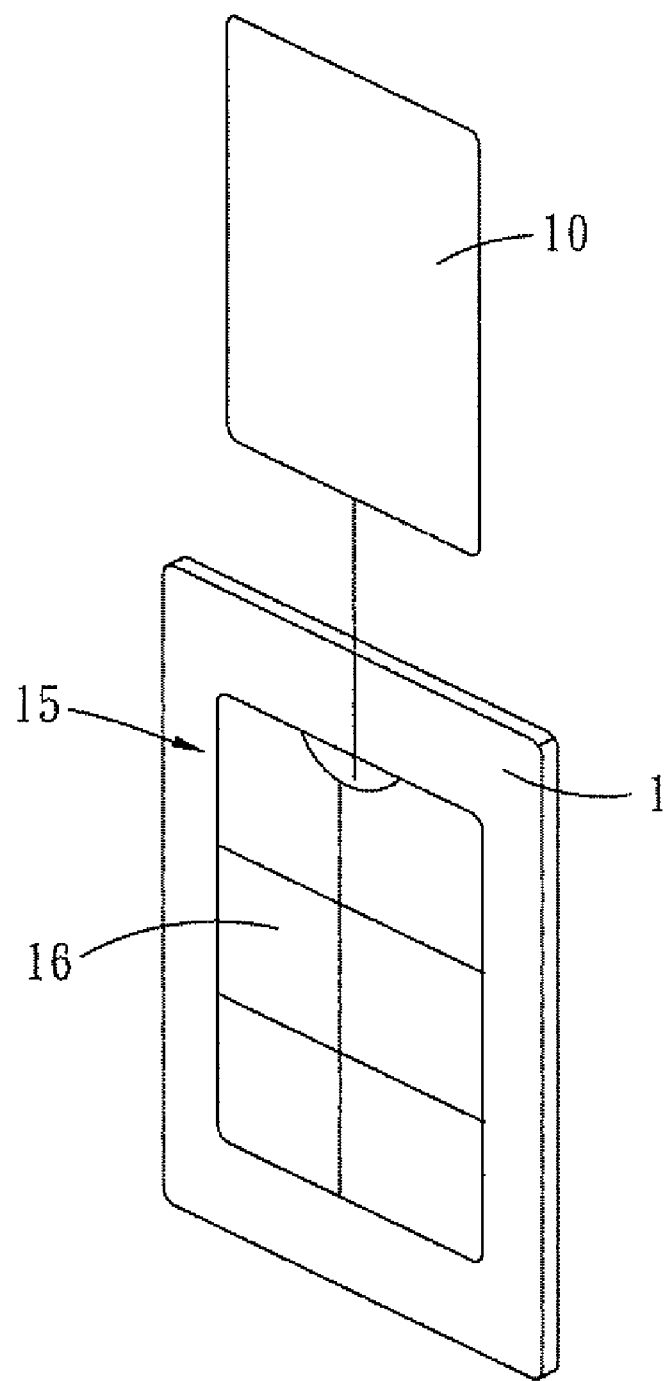
FIG. 8 is an exploded view, showing a muzzle type picture placing area of the present invention.
Figure 9:
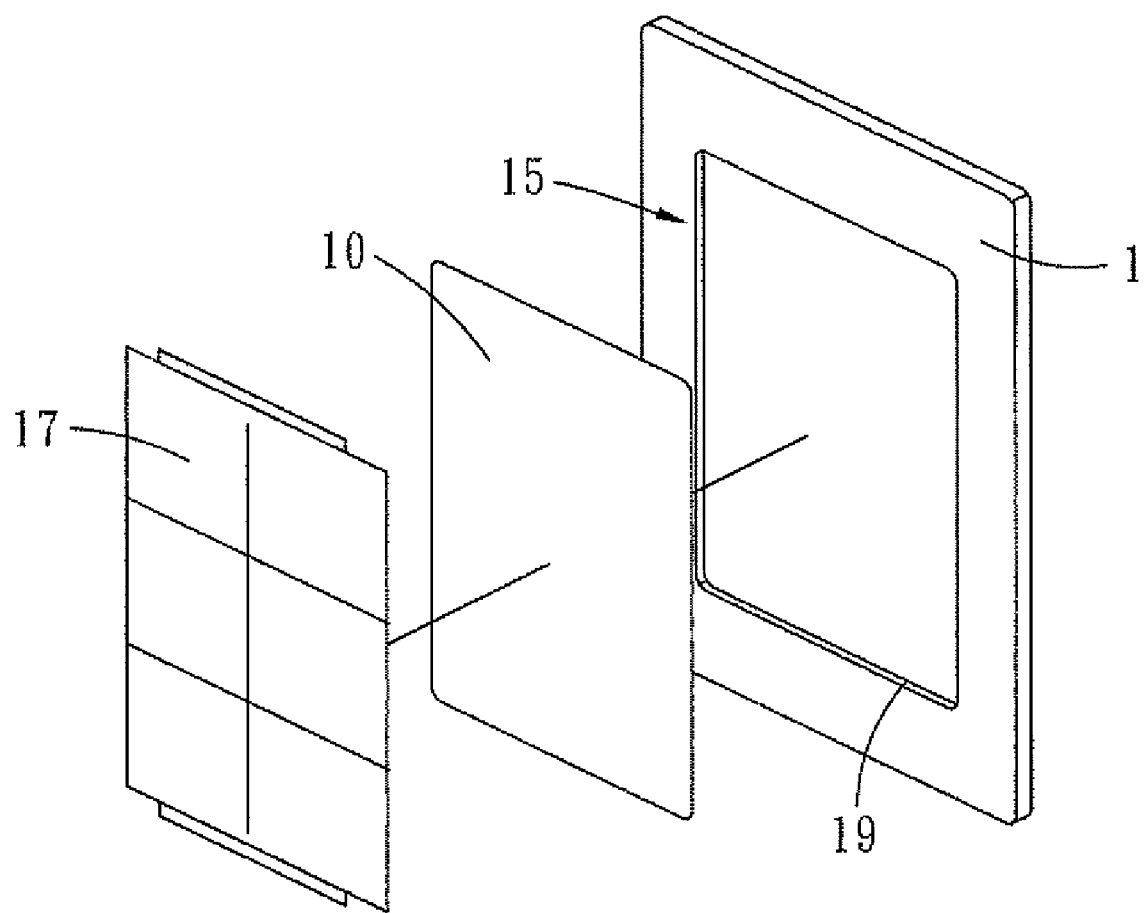
FIG. 9 is an exploded view, showing an indented picture placing area of the present invention.
Figure 10:
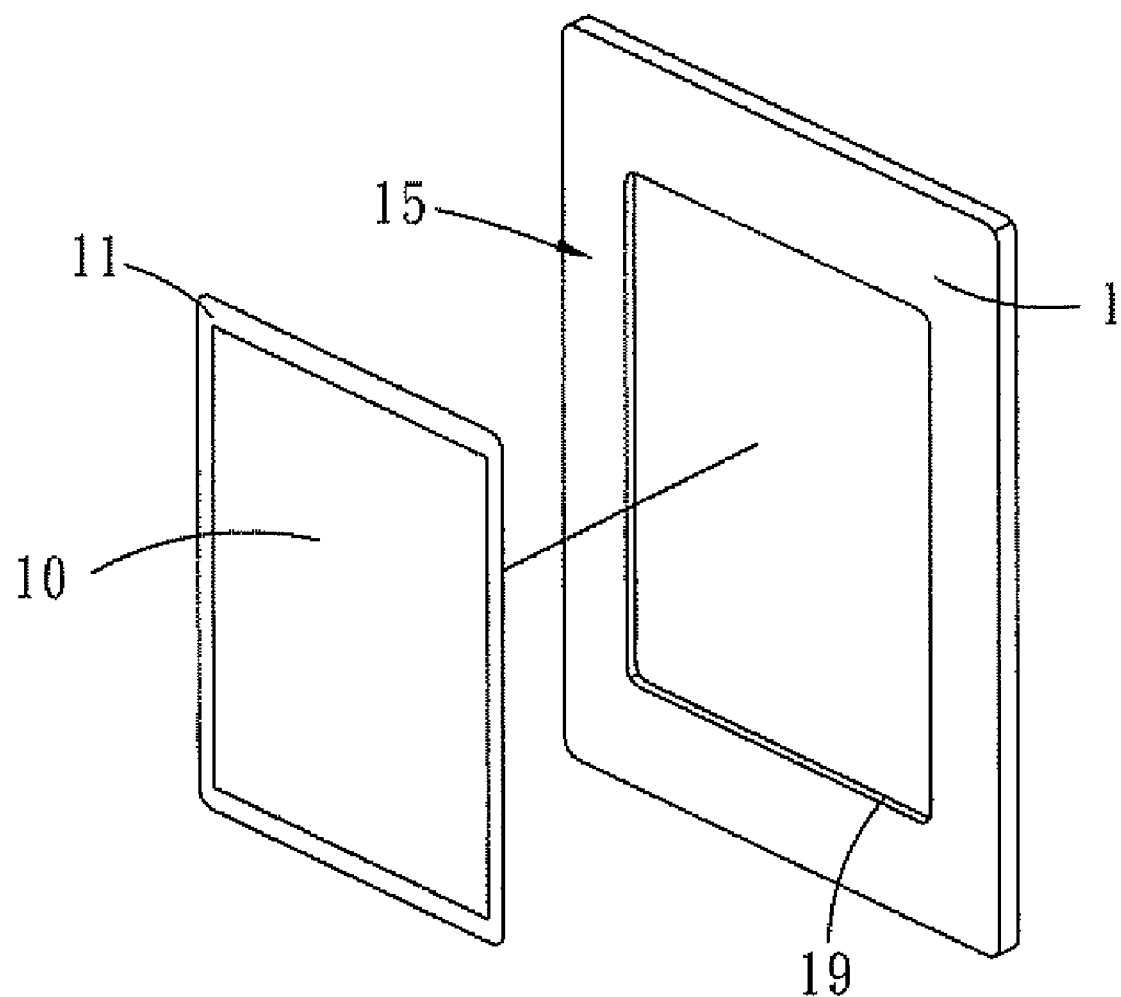
FIG. 10 is an exploded view, showing a laminated picture of the present invention while being adhered onto a picture placing area.

Please refer to FIGS. 8 to 10. A picture placing area 15 may be disposed in front of the medium transferring interface 2 to allow a picture to be placed therein to enable a user to change the outlook of the switch himself to manifest the self style and match it with various different indoor decorations.

While being put into practice, the picture placing area 15 may be constructed by adopting the follow various structures, for example, the picture placing area 15 is built as a transparent cover body with a single-sided opening shown in FIG. 8 to enable a user to place a picture 10 chosen by himself therein depending on his favorite, or the picture placing area 15 is disposed in an indented stepwise transparent window 19 in the center of the front cover 1 as FIG. 9 shows, and a detachable transparent sheet 17 is installed additionally in front of the picture placing area 15, and similarly, it may also be used for clipping a self-chosen picture 10.

Even more, basically, the transparent sheet is unnecessary, a surface of a modeling picture 10 is directly disposed with a laminate layer 11, and a rear side thereof is then spread with a glue and then adhered onto the surface of the medium transferring interface 2 as FIG. 10 shows; it can also achieve the object of a mobile replacement of the picture 10.

As mentioned above, the present invention has the following merits:

1. A touch switch is inducted by a human body which is an inductive medium, processed by a program such that the switch can be controlled accurately.
2. A hermetically sealed touch panel is adopted to provide a function of flame-proof.
3. An overload detection is disposed in the switch to secure the safety while in use.
4. The switch may intercept the external power directly, and no battery is necessary such that the volume thereof can be reduced and the tedious work for frequently replacing the battery can be avoided.
5. The switch emits a sound like a sound produced at the time of a mechanical switch being pressed so that it is compatible with the currently used product.
6. The appearance of the switch can be replaced depending on personal preferences and matching up indoor decorations of a house.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-contact touch switch, utilizing a human body as an inductive medium to enable a control circuit to accurately switch an AC power source comprising:
    an outer cover with an inner side disposed at an outlet of the AC power source;
    a microcomputer control circuit disposed on an inner side of said outer cover;
    a medium transferring interface being disposed on said outer cover, providing a non-conductive substrate and an etched circuit board attached to said non-conductive substrate to and being connected internally to said microcomputer control circuit;
    a start switch being attached to said circuit board, having two ends with one of the ends being connected to said microcomputer control circuit, and another one of the ends providing a control contact connected to said AC power source so as to control electrifying time of an electrical device electrically connected to said outlet; and
    a power interceptor being disposed at the circuit board between and connected to said microcomputer control circuit and said control contact to intercept, rectify, and stabilize an external power supply directly as a useful internal power supply through said AC power source such that the non-contact touch switch is capable of being free from an additional battery to perform a normal work once said external power supply is connected.

2. The non-contact touch switch according to claim 1, wherein a buzzer is connected to said microcomputer control circuit to generate a sound like a sound emitted during a mechanical switch being pressed.

3. The non-contact touch switch according to claim 1, wherein said microcomputer control circuit provides an overload detection unit to detect if the power supply is overload at the time of the power interceptor intercepting the power supply.

4. The non-contact touch switch according to claim 1, wherein said microcomputer control circuit further comprises a measuring linear circuit, a non-linear compensation circuit, a phase comparison logic gate and a MCU microcontroller unit; an end of said measuring linear circuit is connected with said medium transferring interface, another end of said measuring linear circuit is respectively connected with said non-linear compensation circuit and said phase comparison logic gate; one end of said MCU microcontroller unit is connected with said non-linear compensation circuit, and another end of said MCU microcontroller unit is connected with said start switch; said start switch is a zero-phase trigger type start switch; said power interceptor is installed between pins of said MCU microcontroller unit and said control contact of said start switch.

5. The non-contact touch switch according to claim 4, wherein said power interceptor comprises a current amplifying transformer disposed in series on an input end of said control contact of said start switch, a bridge rectifier and a stabilizing diode connected to a secondary terminal to form a power supply circuit with said pins of said MCU microcontroller unit.

6. The non-contact touch switch according to claim 4, wherein said power interceptor comprises a plurality of diodes disposed in series on an input end of said control contact of said start switch, a backward diode is disposed in series on two terminals thereof, a voltage-dividing diode disposed on a middle contact thereof for connecting with a voltage stabilizing IC and a capacitor respectively disposed in series on two sides of said voltage stabilizing IC to form a power supply circuit with said pins of said MCU microcontroller unit.

7. The non-contact touch switch according to claim 6, wherein said power interceptor is further disposed with a field effect transistor to constitute an integrated circuit, a source and a drain of said field effect transistor are respectively coupled to two terminals of said plurality of series diodes, a gate thereof is connected to another pin of said MCU microcontroller unit.

8. The non-contact touch switch according to claim 1, wherein a transparent picture placing area used for allowing a picture to be placed therein is disposed in front of said medium transferring interface.

9. The non-contact touch switch according to claim 8, wherein said picture placing area is disposed in an indented stepwise transparent window on a middle part of said front cover, and a movable detachable transparent sheet is additionally disposed in front of said picture placing area.

10. The non-contact touch switch according to claim 8, wherein a surface of said picture had a laminate layer, a rear side thereof is spread with a glue and then adhered directly onto a surface of said medium transferring interface.

11. The non-contact touch switch according to claim 8, wherein said picture placing area is constitute by a transparent cover with an opening at one side thereof.

* * * * *